United States Patent
Yamakawa et al.

(10) Patent No.: US 7,375,588 B2
(45) Date of Patent: May 20, 2008

(54) TRANSMISSION AMPLIFIER (75) Inventors: Junichiro Yamakawa, Tokyo (JP); Junya Dosaka, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 54 days.

(21) Appl. No.: 10/552,487

(22) PCT Filed: Mar. 23, 2004

(86) PCT No.: PCT/JP2004/003962

§ 371 (c)(1),
(2), (4) Date: May 18, 2006

(87) PCT Pub. No.: WO2004/091093

PCT Pub. Date: Oct. 21, 2004

(65) Prior Publication Data

US 2006/0214730 A1 Sep. 28, 2006

(30) Foreign Application Priority Data

| Apr. 7, 2003 | (JP) | ............................. 2003-102917 |
| Dec. 10, 2003 | (JP) | ............................. 2003-411545 |

(51) Int. Cl.
*H03F 3/04* (2006.01)

(52) U.S. Cl. ...................... 330/289; 330/295; 330/296; 455/127.1

(58) Field of Classification Search ................ 330/289, 330/295, 296; 455/127.1
See application file for complete search history.

(56) References Cited

U.S. PATENT DOCUMENTS

| 3,755,751 A | * | 8/1973 | Ring | ........................ 330/298 |
| 4,122,400 A | * | 10/1978 | Medendorp et al. | ..... 330/207 P |
| 4,345,218 A | * | 8/1982 | Congdon et al. | ........... 330/298 |
| 5,177,453 A | | 1/1993 | Russell et al. | |
| 5,331,291 A | * | 7/1994 | D'Agostino et al. | ........ 330/289 |
| 5,696,467 A | | 12/1997 | McPhilmy et al. | |
| 5,920,808 A | | 7/1999 | Jones et al. | |
| 6,405,057 B1 | | 6/2002 | Wright | |
| 2002/0109550 A1 | | 8/2002 | Dolman et al. | |

FOREIGN PATENT DOCUMENTS

| JP | 53-37341 | 4/1978 |
| JP | 63-309008 | 12/1988 |
| JP | 10-290169 | 10/1998 |
| JP | 11-312989 | 11/1999 |
| JP | 2003-8493 | 1/2003 |
| JP | 2004-173055 | 6/2004 |

* cited by examiner

*Primary Examiner*—Patricia Nguyen
(74) *Attorney, Agent, or Firm*—Wenderoth, Lind & Ponack, L.L.P.

(57) ABSTRACT

A transmission amplifier for amplifying a signal to be transmitted includes an amplifying unit that is warmed efficiently when the temperature is low. In a constitution in which an amplifying unit amplifies a signal, a temperature detecting means detects temperature. Amplifying-unit-self-heating-facilitation control means perform control for facilitating self-heating by the amplifying unit when temperature detected by the temperature detecting means is lower than a predetermined threshold value, or equal to or lower than the predetermined threshold value. The amplifying-unit-self-heating-facilitation control means perform, for example, bias control for the amplifying unit as the control for facilitating self-heating by the amplifying unit.

3 Claims, 8 Drawing Sheets

| Judgment criteria table | |
|---|---|
| Input level Pi | Temperature difference $\Delta Ti$ |
| Pi0<Pi<Pi1 | $\Delta T0$ |
| Pi1<Pi<Pi2 | $\Delta T1$ |
| Pi2<Pi | $\Delta T2$ |

TRANSMISSION AMPLIFIER

CROSS-REFERENCES TO RELATED APPLICATIONS

This application is the National Stage of International Application No. PCT/JP2004/003962, filed Mar. 23, 2004.

FIELD OF THE INVENTION

The present invention relates to a transmission amplifier that amplifies a signal to be transmitted, and in particular to a transmission amplifier that warms an amplifying unit efficiently when temperature is low.

DESCRIPTION OF RELATED ART

For example, amplifiers are used for amplifying a signal in the field of communication and the like.

As an example, in a transmission amplifier used in a transmission unit of an outdoor base station apparatus, a signal to be transmitted to a mobile station apparatus, which becomes a communication partner, is amplified.

In such an outdoor base station apparatus, in particular, in cold regions, for the purpose of stabilization of an operation of the transmission amplifier at the time of low temperature, for example, a heater is attached to the base station apparatus to cope with the low temperature.

As an example, a temperature range in which normal performance of the transmission amplifier is guaranteed (a performance guaranteed temperature range) is −10° C. to +50° C. When temperature is low compared with the performance guaranteed temperature range, in particular, in the case of cold regions, it is difficult to satisfy specifications. For example, as lowest temperature in cold regions, it is necessary to take into account temperature as low as about −30° C., which is likely to cause malfunction.

For example, in a feed-forward control amplifier used in a mobile radio system, in general, it is necessary to warm up the apparatus in order to avoid a fall in a gain of an output level with respect to an input level. In recent years, a method of reducing time required for the warm-up has been examined because of a demand for a reduction in build-up time.

Examples of Conventional Techniques are Described Below

Conventionally, in a battery-driven portable electronic device, a power supply of a heater is subjected to ON/OFF control on the basis of temperature information obtained by a temperature sensor to warm a liquid crystal display element with the heater and make liquid crystal display possible (see, for example, JP-A-10-253947).

In addition, conventionally, in a distortion compensating amplifier, in switching plural compensation value tables according to temperature of an amplifying unit to execute distortion compensation for the amplifying unit, the number of compensation value tables to be prepared is reduced to realize a reduction in size of the amplifier by adjusting temperature of the amplifying unit to temperature corresponding to the compensation tables on the basis of measured temperature of the amplifying unit (see, for example, JP-A-10-320246). As means for adjusting temperature of the amplifying unit, a Peltier element, a cooling fan, or a heater is used (see, for example, JP-A-320246).

However, in the conventional transmission amplifiers and the like, since the heater or the like is added to warm the amplifying unit, there is a deficiency that cost increases. A further reduction in size of the apparatuses is desired. Efficiency of warming up of the apparatuses is also desired.

The invention has been devised in view of such conventional circumstances and it is an object of the invention to provide a transmission amplifier that can warm an amplifying unit efficiently. The invention realizes, for example, a reduction in cost, a reduction in size of the apparatus, and efficiency of warming-up for the apparatus.

BRIEF SUMMARY OF THE INVENTION

In order to attain the objects, in a transmission amplifier according to the invention, in amplifying a signal to be transmitted with an amplifying unit for amplifying a signal, temperature of the amplifying unit is adjusted as described below.

Temperature detecting means detects temperature. Amplifying-unit-self-heating-facilitation control means performs control for facilitating self-heating by the amplifying unit when temperature detected by the temperature detecting means is lower than a predetermined threshold value or equal to or lower than the predetermined threshold value.

Therefore, when temperature is low, self-heating by the amplifying unit is facilitated and the amplifying unit is warmed. Thus, it is possible to warm the amplifying unit efficiently when temperature is low. For example, compared with the constitution in which a heater or the like is added, it is possible to reduce cost and realize a reduction in size.

Note that the amplifying-unit-self-heating-facilitation control means may adopt, for example, a constitution for performing the control for facilitating self-heating by the amplifying unit when temperature detected by the temperature detecting means is lower than the predetermined threshold value. Alternatively, the amplifying-unit-self-heating-facilitation control means may adopt a constitution for performing the control for facilitating self-heating by the amplifying unit when temperature detected by the temperature detecting means is equal to or lower than the predetermined threshold value.

Various transmission amplifiers may be used as the transmission amplifier.

Various signals maybe used as the signal to be transmitted.

Amplifying units of various constitutions may be used as the amplifying unit. For example, an amplifying unit constituted by one amplifying element may be used or an amplifying unit constituted by plural amplifying elements may be used.

Various temperature detecting means such as a temperature sensor may be used as the temperature detecting means. Various places may be used as a place where the temperature detecting means is provided. For example, it is preferable to provide the temperature detecting means near the amplifying unit, in a position in contact with the amplifying unit, in the inside of the amplifying unit, and the like.

Various values may be used as the predetermined threshold value concerning temperature. For example, a value of boundary temperature at which it is necessary to warm the amplifying unit is used.

Various kinds of control may be used as the control for facilitating self-heating by the amplifying unit.

Various periods may be used as a period for performing temperature adjustment for the amplifying unit. For example, it is possible to use a period in which the signal to be transmitted is not amplified by the amplifying unit, a period in which an amount of the signal to be transmitted, which is amplified by the amplifying unit, is small, or other periods.

In the transmission amplifier according to the invention, as an example of a constitution, the amplifying-unit-self-heating-facilitation control means performs bias control for the amplifying unit as the control for facilitating self-heating by the amplifying unit.

Therefore, it is possible to adjust temperature of the amplifying unit with simple control of the bias control for the amplifying unit.

Various forms may be used as a form for controlling a bias at the amplifying unit.

As an example, when the amplifying unit is constituted by a Field Effect Transistor (FET), it is possible to use a form for facilitating self-heating by the field effect transistor by increasing a gate-to-source voltage of the field effect transistor.

In the transmission amplifier according to the invention, as an example of a constitution, temperature of the amplifying unit is adjusted as described below.

Concerning temperature, a predetermined first threshold value is provided and a predetermined second threshold value lower than the first threshold value is provided.

The amplifying-unit-self-heating-facilitation control means performs the control for facilitating self-heating by the amplifying unit when temperature detected by the temperature detecting means is lower than the second threshold value or equal to or lower than the second threshold value. When temperature detected by the temperature detecting means exceeds the first threshold value or rises to be equal to or higher than the first threshold value, the amplifying-unit-self-heating-facilitation control means stops the control for facilitating self-heating by the amplifying unit.

Therefore, when temperature is low on the basis of the second threshold value, self-heating by the amplifying unit is facilitated, for example, continuously, and the amplifying unit is warmed. When temperature rises to some degree on the basis of the first threshold value, such facilitation control for self-heating by the amplifying unit is stopped. Consequently, efficient temperature control for the amplifying unit is realized as a whole.

Note that the amplifying-unit-self-heating-facilitation control means may adopt, for example, a constitution for performing the control for facilitating self-heating by the amplifying unit when temperature detected by the temperature detecting means is lower than the second threshold value. Alternatively, the amplifying-unit-self-heating-facilitation control means may adopt a constitution for performing the control for facilitating self-heating by the amplifying unit when temperature detected by the temperature detecting means is equal to or lower than the second threshold value.

The amplifying-unit-self-heating-facilitation control means may adopt, for example, a constitution for stopping the control for facilitating self-heating by the amplifying unit when temperature detected by the temperature detecting means exceeds the first threshold value. Alternatively, the amplifying-unit-self-heating-facilitation control means may adopt a constitution for stopping the control for facilitating self-heating by the amplifying unit when temperature detected by the temperature detecting means rises to be equal to or higher than the first threshold value.

Various values may be used as the predetermined second threshold value concerning temperature. For example, a value of boundary temperature at which it is necessary to warm the amplifying unit is used. In addition, various values may be used as the predetermined first threshold value concerning temperature. For example, a value of boundary temperature at which the amplifying unit is warmed sufficiently and it is unnecessary to warm the amplifying unit is used.

In the transmission amplifier according to the invention, as an example of a constitution, the amplifying unit is constituted using plural amplifying elements. The amplifying-unit-self-heating-facilitation control means performs bias control for the plural amplifying elements as the control for facilitating self-heating by the amplifying unit.

Therefore, it is possible to realize temperature control for the amplifying unit by performing bias control for the plural amplifying elements.

Various numbers may be used as the number of the plural amplifying elements constituting the amplifying unit.

Various amplifying elements such as a field effect transistor may be used as the amplifying elements.

As a form of performing bias control for the plural amplifying elements, for example, a form of performing bias control for the respective amplifying elements separately may be adopted. Alternatively, a form of performing bias control for two or more amplifying elements collectively may be adopted.

In the transmission amplifier according to the invention, as an example of a constitution, amplifying-unit-self-heating-facilitation-control-time-signal attenuating means attenuates a signal to be amplified by the amplifying unit when the control for facilitating self-heating by the amplifying unit is performed by the amplifying-unit-self-heating-facilitation control means.

Therefore, it is possible to prevent an unnecessary signal from being outputted, for example, in a period in which the control for facilitating self-heating by the amplifying unit is continuously performed by the amplifying-unit-self-heating-facilitation control means.

In the invention, a signal to be transmitted is used as the signal to be amplified by the amplifying unit. For example, a signal before being inputted to the amplifying unit is used.

Various degrees may be used as a degree of attenuating a signal to be amplified by the amplifying unit as long as, for example, the degrees are effective practically.

An example of a constitution according to the invention will be further described below.

In the transmission amplifier according to the invention, as an example of a constitution, a constitution for amplifying a signal to be transmitted includes: an amplifying unit that amplifies the signal; signal level detecting means that detects a level of the signal; temperature detecting means that detects temperature in a position close to the amplifying unit as first temperature and detects temperature in a position far from the amplifying unit as second temperature; and amplifying-unit-warm-up-processing control means that stops warm-up processing for the amplifying unit, when, in performing the warm-up processing for the amplifying unit, a magnitude of a difference between the first temperature and the second temperature detected by the temperature detecting means is equal to or larger than a threshold value corresponding to a signal level detected by the signal level detecting means or when the magnitude of the difference exceeds the threshold value.

In such a transmission amplifier, in amplifying a signal to be transmitted with the amplifying unit for amplifying a signal, processing described below is performed.

The signal level detecting means detects a level of a signal to be amplified by the amplifying unit. The temperature detecting means detects temperature in a position close to the amplifying unit as first temperature and detects temperature in a position far from the amplifying unit as second temperature. In performing warm-up processing for the amplifying unit, when a magnitude of a difference between the first temperature and the second temperature detected by the temperature detecting means is equal to or larger than a threshold value corresponding to a signal level detected by the signal level detecting means or when the magnitude of the difference exceeds the threshold value, the amplifying-unit-warm-up-processing control means stops the warm-up processing.

Therefore, in performing the warm-up processing for the amplifying unit, when a magnitude of a difference between temperature in a position close to the amplifying unit and temperature in a position far from the amplifying unit reaches a threshold value corresponding to a level of a signal to be amplified by the amplifying unit, the warm-up processing is stopped. Thus, it is possible to execute warming-up processing corresponding to a level of a signal to be amplified by the amplifying unit and realize efficiency of warming-up.

Note that the amplifying-unit-warm-up-processing control means may adopt a constitution for stopping the warm-up processing, for example, when the magnitude of the difference between the first temperature and the second temperature detected by the temperature detecting means is equal to or larger than the threshold value corresponding to a signal level detected by the signal level detecting means. Alternatively, the amplifying-unit-warm-up-processing control means may adopt a constitution for stopping the warm-up processing when the magnitude of the difference between the first temperature and the second temperature detected by the temperature detecting means exceeds the threshold value corresponding to a signal level detected by the signal level detecting means.

Various levels may be used as the signal level. For example, it is possible to use a level of amplitude, a level of electric power, and the like.

Temperature in various positions may be used as the temperature in a position close to the amplifying unit (the first temperature). For example, temperature on which a change in temperature of the amplifying unit is reflected may be used, temperature of the amplifying unit itself may be used, or temperature in a position slightly separated from the amplifying unit may be used.

Temperature in various positions may be used as the temperature in a position far from the amplifying unit (the second temperature). For example, temperature on which a change in temperature of the amplifying unit is not reflected is used.

Note that, as another constitutional example, it is also possible to adopt a constitution for detecting, regardless of a separation distance from the amplifying unit, temperature in a position where a change in temperature of the amplifying unit is reflected on temperature or a position where influence due to a change in temperature of the amplifying unit is large as first temperature and detecting temperature in a position where a change in temperature of the amplifying unit is not reflected on temperature or a position where influence due to a change in temperature of the amplifying unit is small as second temperature.

For example, processing for warming the amplifying unit is used as the warm-up processing for the amplifying unit. Various kinds of processing may be used as the warm-up processing. For example, processing for facilitating self-heating by the amplifying unit with bias control of the amplifying unit may be used. Alternatively, processing for warming the amplifying unit with a heater or the like may be used.

Various values may be used as the threshold value corresponding to a signal level detected by the signal level detecting means. For example, when the threshold value is a signal level detected by the signal level detecting means, a value of a magnitude of a difference between a first temperature and a second temperature in the case in which the amplifying unit is warmed and the transmission amplifier, the amplifying unit, or the like comes into a stable state or a value close to the value is used.

As an example of a constitution, the transmission amplifier includes signal-level-and-temperature-difference-threshold-correspondence storing means that stores a correspondence of the signal level and the threshold value concerning the temperature difference (a temperature difference threshold). The amplifying-unit-warm-up-processing control means controls the warm-up processing for the amplifying unit on the basis of contents of the correspondence stored by the signal-level-and-temperature-difference-threshold-correspondence storing means.

As an example of a constitution, in performing the warm-up processing for the amplifying unit, the amplifying unit warm-up processing control means detects, for every predetermined period, a magnitude of a difference between a first temperature and a second temperature detected by the temperature detecting means. When the detected magnitude of the difference increases to be equal to or larger than the threshold value corresponding to a signal level detected by the signal level detecting means or when the magnitude exceeds the threshold value, the amplifying-unit-warm-up processing control means stops the warm-up processing.

Various periods may be used as the predetermined period. For example, a fixed period may be used or a variable period may be used.

An example of a constitution according to the invention will be further described below.

The transmission amplifier according to the invention is provided, for example, in a transmitting unit of a radio or wire communication apparatus and in a radio or wire transmitter.

Various communication apparatuses, transmitting units, and transmitters may be used as the communication apparatus, the transmitting unit, and the transmitter.

The transmission amplifier according to the invention is provided in a distortion compensating amplifier such as a feed-forward control amplifier of a mobile radio system.

The transmission amplifier according to the invention is provided in a transmitting unit of a base station apparatus of a radio communication system such as a mobile radio communication system (a mobile communication system) or a stationary radio communication system.

Various mobile radio communication systems such as a cellular phone system and a Personal Handy phone System (PHS) may be used as the mobile radio communication system.

Various stationary radio communication systems such as a Fixed Wireless Access (FWA) may be used as the stationary radio communication system.

Another example of a constitution concerning a technical thought according to the invention will be described below.

It is possible to apply the technical thought according to the invention to, for example, a distortion compensating transmission amplifying apparatus.

As an example, the distortion compensating transmission amplifying apparatus adjusts temperature of an amplifying unit by performing control for facilitating self-heating by the amplifying unit in switching plural distortion compensation table corresponding to plural temperatures according to temperature and compensating for distortion, which occurs in the amplifying unit, on the basis of control information concerning distortion compensation set in the distortion compensation table.

It is possible to apply the technical thought according to the invention to, for example, various amplifiers.

As an example, an amplifier for amplifying a signal includes: an amplifying unit that amplifies a signal; temperature detecting means that detects temperature; and amplifying-unit-self-heating-facilitation control means that performs control for facilitation self-heating by the amplifying unit when temperature detected by the temperature detecting means is lower than a predetermined threshold value or equal to or lower than the predetermined threshold value.

It is possible to apply the technical thought according to the invention to, for example, various apparatuses for performing various kinds of processing.

As an example, an apparatus for performing processing includes: a processing unit that performs processing; temperature detecting means that detects temperature; and processing-unit-self-heating-facilitation control means that performs control for facilitating self-heating by the processing unit when temperature detected by the temperature detecting means is lower than a predetermined threshold value or equal to or lower than the predetermined threshold value.

DETAILED DESCRIPTION OF THE INVENTION

Embodiments according to the invention will be explained with reference to the drawings.

In the embodiments, the invention is applied to a transmission amplifier with a warm-up function that is used in a base station apparatus installed outdoors in a mobile communication system.

A transmission amplifier according to a first embodiment will be explained.

Figure 1:
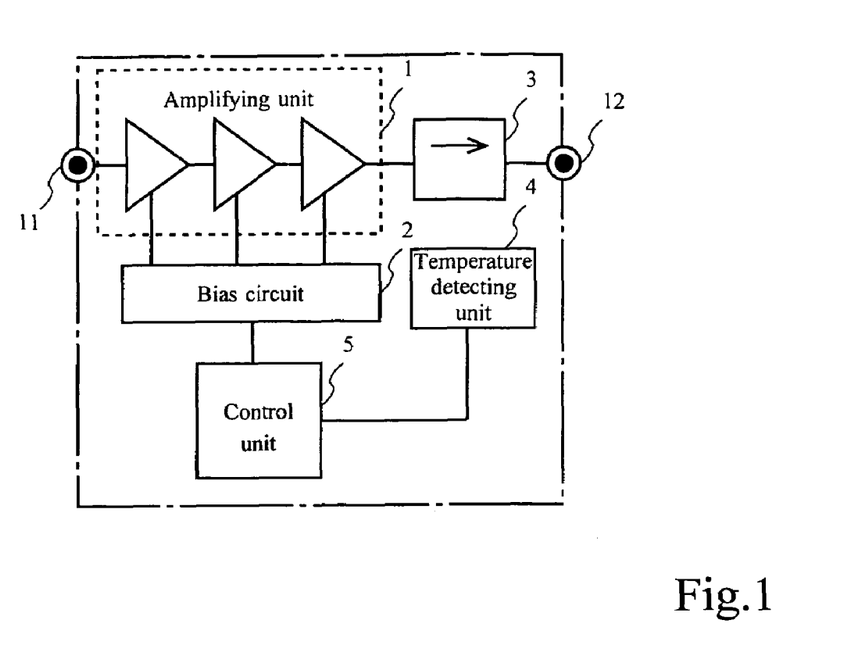
FIG. 1 is a diagram showing an example of a constitution of a transmission amplifier according to a first embodiment of the invention.

FIG. 1 shows an example of a constitution of the transmission amplifier in the first embodiment.

The transmission amplifier in the first embodiment includes an amplifying unit 1, a bias circuit 2, an isolator 3, a temperature detecting unit 4, a control unit 5, an input terminal 11, and an output terminal 12.

The transmission amplifier in the first embodiment amplifies a signal to be transmitted, which is inputted from the input terminal 11, and outputs the amplified signal from the output terminal 12. The output signal is transmitted by radio through, for example, an antenna (not shown) provided at a post-stage.

The amplifying unit 1 is constituted by, for example, connecting plural amplifying elements in series. The amplifying unit 1 amplifies a signal inputted from the input terminal 11 and outputs the amplified signal to the isolator 3.

The bias circuit 2 controls biases of the respective amplifying elements constituting the amplifying unit 1 in a form in which the bias circuit 2 is controlled by the control unit 5.

In the first embodiment, the isolator 3 is provided for prevention of an invasion wave and prevention of breakage of the amplifying unit 1. The isolator 3 outputs an amplified signal inputted from the amplifying unit 1 to the output terminal 12.

The temperature detecting unit 4 is provided, for example, near the amplifying unit 1. The temperature detecting unit 4 detects temperature of the amplifying unit 1 or temperature in the vicinity of the amplifying unit 1 and outputs a result of the detection.

The control unit 5 has a function of performing various kinds of control. In the first embodiment, the control unit 5 controls the bias circuit 2 on the basis of a result of detection of temperature inputted from the temperature detecting unit 4 to thereby control a form of controlling biases of the respective amplifying elements with the bias circuit 2.

Note that, in the first embodiment, the control unit 5 has a function of a storing unit that stores a first threshold value Tth1 and a second threshold value Tth2 concerning temperature and a function of an A/D (Analog to Digital) conversion unit that converts a result of temperature detection in an analog value inputted from the temperature detecting unit 4 into a digital value. The control unit 5 compares a result of temperature detection T converted into a digital value by the A/D conversion function and the first threshold value Tth1 and the second threshold value Tth2 stored by the storing function and performs bias control for the respective amplifying elements according to a result of the comparison.

Figure 2:
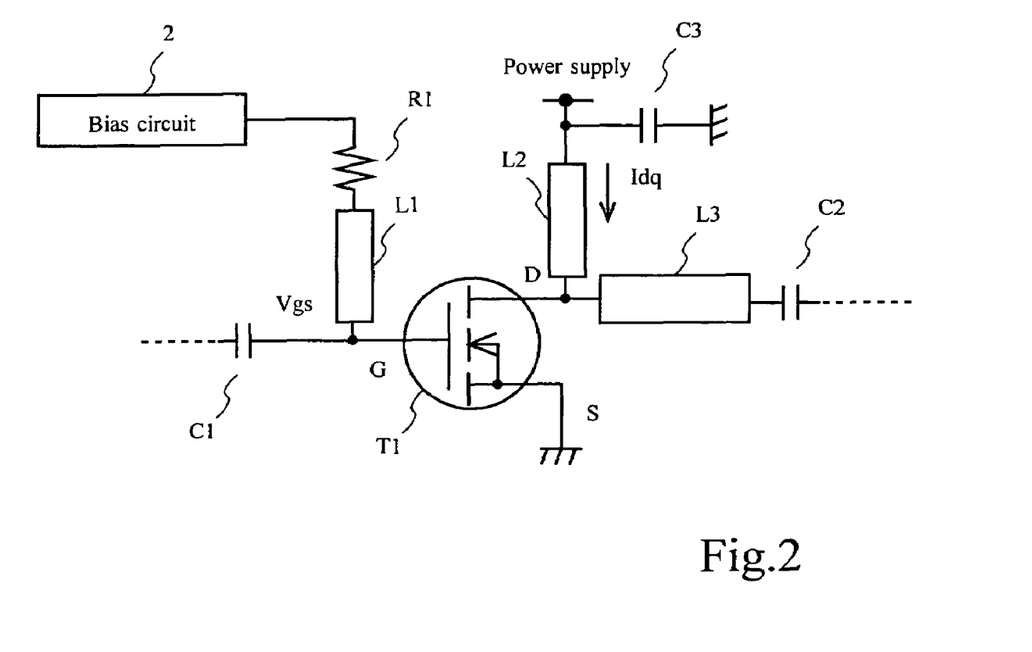
FIG. 2 is a diagram showing an example of a constitution of a part of an amplifying unit.

FIG. 2 shows an example of a constitution of a part of the amplifying unit 1. In the first embodiment, a general example of a constitution concerning one amplifying element is described. Note that, in the first embodiment, a field effect transistor T1 is used as the amplifying element.

In the first embodiment, a capacitor C1 and one end of a micro-strip line L1 are connected to a gate (G) of the field effect transistor T1 in parallel. The bias circuit 2 is connected to the other end of the micro-strip line L1 via a resistor R1.

A source (S) of the field effect transistor T1 is grounded.

One end of a micro-strip line L2 and one end of a micro-strip line L3 are connected to a drain (D) of the field effect transistor T1 in parallel. A power supply and a capacitor C3 are connected to the other end of the micro-strip line L2. A capacitor C2 is connected to the other end of the micro-strip line L3.

In such a constitution, the control unit 5 can control a magnitude of a voltage Vgs between the gate and the source of the field effect transistor T1 (a gate-to-source voltage) by, for example, controlling a magnitude of a voltage applied to the gate of the field effect transistor T1 by the bias circuit 2. Consequently, the control unit 5 can control a magnitude of a drain current Idq of the field effect transistor T1.

Figure 3:
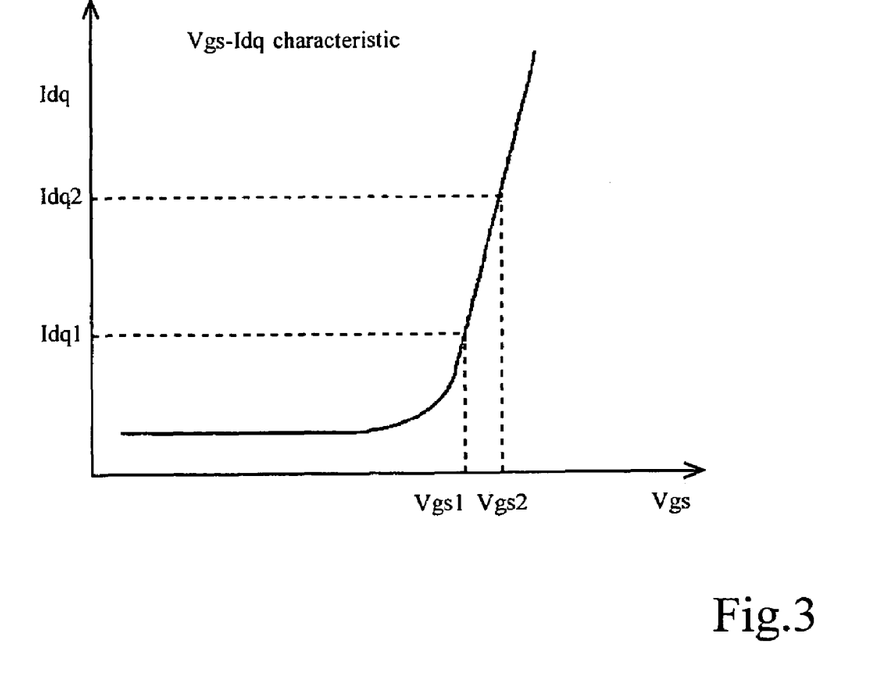
FIG. 3 is a diagram showing an example of a relation between a gate-to-source voltage and a drain current in the amplifying unit.

FIG. 3 shows an example of a characteristic of a relation between the gate-to-source voltage Vgs and the drain current Idq in a constitution shown in FIG. 2. An abscissa of a graph in FIG. 3 indicates the gate-to-source voltage Vgs and an ordinate indicates the drain current Idq.

As shown in FIG. 3, when the gate-to-source voltage Vgs increases to some degree, the drain current Idq increases as the gate-to-source voltage Vgs increases.

Figure 4:
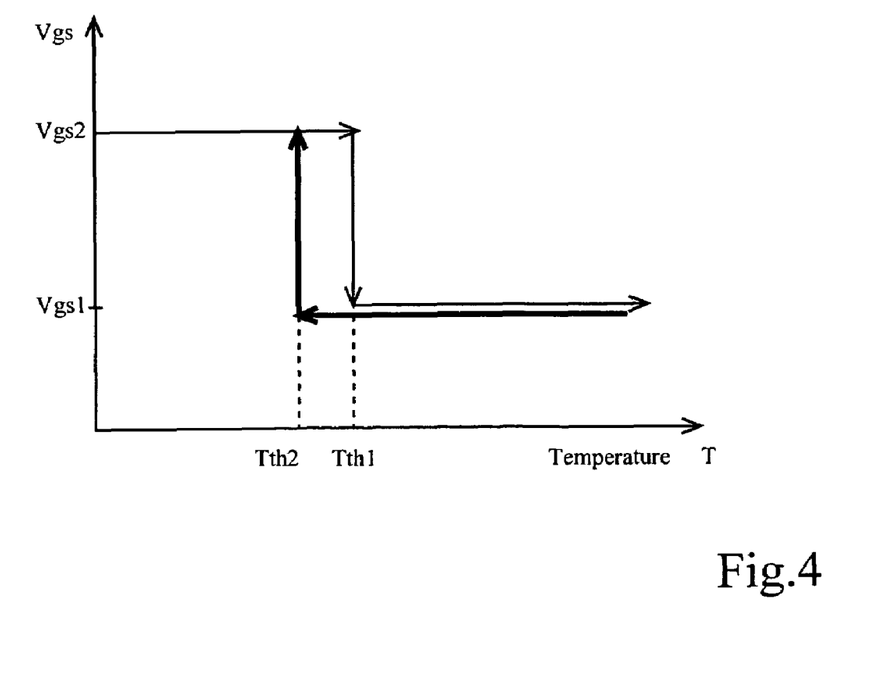
FIG. 4 is a diagram showing an example of a form of controlling the gate-to-source voltage for the amplifying unit according to temperature.

FIG. 4 shows an example of a characteristic of a form of controlling the gate-to-source voltage Vgs according to temperature detected by the temperature detecting unit 4 via the bias circuit 2.

An abscissa of a graph in the figure indicates temperature T and an ordinate indicates the gate-to-source voltage Vgs.

In the first embodiment, temperature at which an operation of the amplifying unit 1 comes into a stable state is set as the first threshold value Tth1 concerning temperature and temperature at which an operation of the amplifying unit 1 comes into an unstable state is set as the second threshold value Tth2 concerning temperature. Note that Tth1 is larger than Tth2.

In the first embodiment, Vgs1 is set as the gate-to-source voltage Vgs that is used in a state in which an operation of the amplifying unit 1 is stable (at a normal time) and Vgs2 is set as the gate-to-source voltage Vgs in a state in which an operation of the amplifying unit 1 is unstable. Note that Vgs2 is larger than Vgs1. In addition, a drain current Idq2 corresponding to Vgs2 is larger than a drain current Ddq1 corresponding to Vgs1.

In the first embodiment, when the bias circuit 2 is not specifically controlled by the control unit 5, the usual bias voltage Vgs1 is applied by the bias circuit 2 as the gate-to-source voltage Vgs. It is possible to switch the gate-to-source voltage Vgs applied by the bias circuit 2 to Vgs2 when the bias circuit 2 is controlled by the control unit 5.

For example, the control unit 5 controls, on the basis of temperature detected by the temperature detecting unit 4, the gate-to-source voltage Vgs to be the usual bias voltage Vgs1 when the temperature is equal to or higher than the temperature Tth1 at which an operation of the amplifying unit 1 comes into a stable state. Thereafter, when the temperature falls to be equal to or lower than the temperature Tth2 at which the operation of the amplifying unit 1 comes into an unstable state, the control unit controls the gate-to-source voltage Vgs to increase from the usual bias voltage Vgs1 to Vgs2 and controls the drain current Idq of the amplifying unit 1 from the usual drain current Idq1 to Idq2 to thereby increase a self-heating value of the amplifying unit 1 itself. Thereafter, when the temperature rises to be equal to or higher than the temperature Tth1 at which the operation of the amplifier 1 comes into a stable state, the control unit 5 controls the gate-to-source voltage Vgs to decrease from Vgs2 to the usual bias voltage Vgs1 again.

In this way, in the first embodiment, a hysteresis characteristic shown in a graph in FIG. 4 is used such that, in the case in which the temperature T falls from temperature higher than Tth1, a bias voltage is changed when the temperature T falls to be lower than Tth2 and, in the case in which the temperature T rises from temperature lower than Tth2, a bias voltage is changed when the temperature T rises to be equal to or higher than Tth1. Consequently, malfunction is prevented.

In the first embodiment, in an initial period such as the time of power-on, when the temperature T detected by the temperature detecting unit 4 is lower than Tth1 and equal to or higher than Tth2, the control unit 5 controls the gate-to-source voltage Vgs to be the usual bias voltage Vgs1.

In addition, in the first embodiment, in an initial period such as the time of power-on, when the temperature T detected by the temperature detecting unit 4 is less than Tth2, the control unit 5 controls the gate-to-source voltage Vgs to Vgs2 via the bias circuit 2.

As a specific example, it is possible to adopt a form in which, as the first threshold value Tth1 and the second threshold value Tth2 concerning temperature, the first threshold value Tth1 is set to −10° C., which is a lower limit value of a performance compensation temperature range of the transmission amplifier, and the second threshold value Tth2 is set to a low value compared with the first threshold value Tth1.

As another specific example, it is possible to adopt a form in which, as the first threshold value Tth1 and the second threshold value Tth2 concerning temperature, the second threshold value Tth2 is set to −10° C., which is a lower limit value of the performance compensation temperature range of the transmitter amplifier, and the first threshold value Tth1 is set to a high value compared with the second threshold value Tth2.

Figure 5:
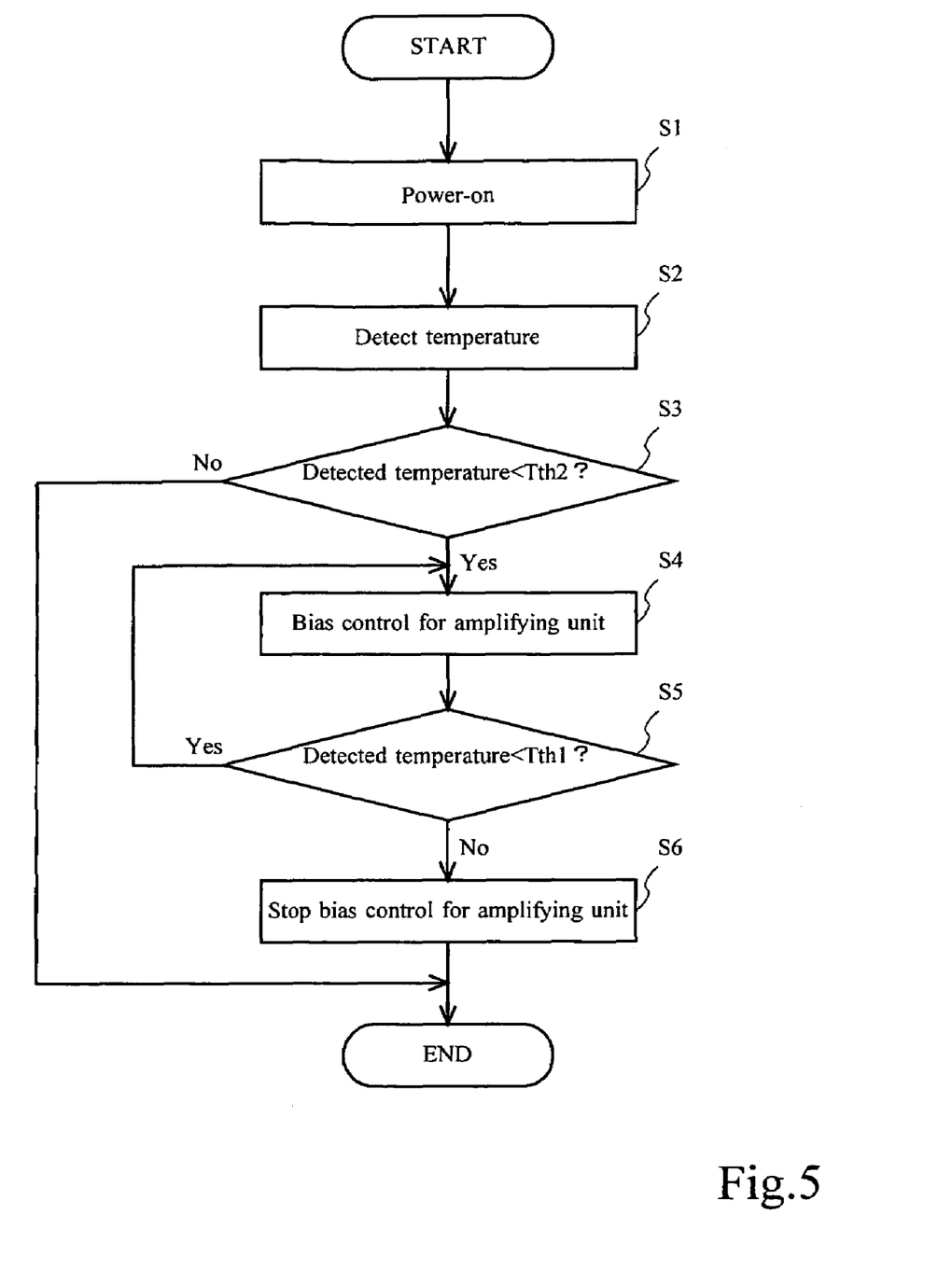
FIG. 5 is a diagram showing an example of a procedure of processing for controlling a bias for the amplifying unit according to temperature.

FIG. 5 shows an example of a procedure of processing for controlling a bias of the amplifying unit 1 with the control unit 5 according to temperature via the bias circuit 2.

In the transmission amplifier, first, when a power supply is turned on (step S1), the temperature detecting unit 4 detects temperature (step S2). The control unit 5 compares the temperature detected (the detected temperature) and the second threshold value Tth2 (step S3). When the detected temperature is equal to or higher than the second threshold value Tth2, the control unit 5 ends this processing such that the usual bias voltage Vgs1 is applied as the gate-to-source voltage Vgs of the amplifying unit 1.

On the other hand, when the detected temperature is lower than the second threshold value Tth2 in a result of the comparison (step S3), the control unit 5 controls the gate-to-source voltage Vgs of the amplifying unit 1 to be Vgs2 via the bias circuit 2 (step S4). Then, a heating value increases in the amplifying unit 1 and the amplifying unit 1 is warmed. Temperature detected by the temperature detecting unit 4 rises.

Thereafter, the control unit 5 monitors temperature detected by the temperature detecting unit 4 and compares the detected temperature and the first threshold value Tth1 (step S5). When the detected temperature rises to be equal to or higher than the first threshold value Tth1, the control unit 5 stops the bias control for the amplifying unit 1 (step S6) such that the usual bias voltage Vgs1 is applied as the gate-to-source voltage Vgs of the amplifying unit 1.

The temperature control for the amplifying unit 1 at the time of power-on of the transmission amplifier is described above. However, for example, it is also possible to perform temperature control for the amplifying unit 1 when temperature in the transmission amplifier falls at the time of operation of the transmission amplifier such as at night and at the time of low traffic. Specifically, the control unit 5 monitors temperature detected by the temperature detecting unit 4 and performs bias control for the amplifying unit 1 on the basis of the detected temperature and the threshold values Tth1 and Tth2.

As described above, in the transmission amplifier in the first embodiment, the temperature detecting unit 4 is provided for the amplifying unit 1 and, when temperature detected by the temperature detecting unit 4 is low compared with a predetermined threshold value (in the first embodiment, the second threshold value Tth2), control for a bias is executed on the plural amplifying elements constituting the amplifying unit 1. Consequently, control for facilitating self-heating of the plural amplifiers is performed.

In the transmission amplifier in the first embodiment, the first threshold value Tth1 and the second threshold value Tth2 lower than the first threshold value Tth1 are provided concerning temperature. When temperature detected by the temperature detecting unit 4 is low compared with the second threshold value Tth2, the amplifying unit 1 is controlled to facilitate self-heating of the amplifying unit 1. When the detected temperature rises to be equal to or higher than the first threshold value Tth1, the self-heating facilitation control for the amplifying unit 1 is stopped.

Therefore, in the transmission amplifier in the first embodiment, even when environmental temperature is low, a bias of the amplifying unit 1 is controlled and an idle current of the amplifying unit 1 is increased. As a result, a self-heating value of the amplifying unit 1 can be increased to warm the amplifying unit 1. Consequently, for example, it is possible to shift the transmission amplifier to an operation stable state in terms of temperature early. In this way, in the transmission amplifier in the first embodiment, an increase in internal temperature is facilitated by self-heating of the amplifying unit 1. Thus, a heater for preheating is not always necessary. Consequently, it is possible to reduce cost and reduce a size of the apparatus.

In the first embodiment, the two threshold values Tth1 and Tth2 are provided concerning temperature to perform temperature adjustment for the amplifying unit 1. However, for example, it is also possible to provide only one threshold value Tth concerning temperature. As an example, it is possible to adopt a constitution in which, when temperature detected by the temperature detecting unit 4 is lower than the threshold value Tth (or equal to or lower than the threshold value Tth), the gate-to-source voltage Vgs of the amplifying unit 1 is controlled to Vgs2 and, on the other hand, when the detected temperature is equal to or higher than the threshold value Tth (or exceeds the threshold value Tth), the gate-to-source voltage Vgs of the amplifying unit 1 to be the usual bias voltage Vgs1.

Note that, in the first embodiment, the temperature detecting means is constituted by the function with which the temperature detecting unit 4 detects temperature in the vicinity of the amplifying unit 1. The amplifying-unit-self-heating-facilitation control means is constituted by the function with which the control unit 5 controls a bias (in this embodiment, the gate-to-source voltage Vgs) of the amplifying unit 1 via the bias circuit 2.

A transmission amplifier according to a second embodiment will be explained.

Figure 6:
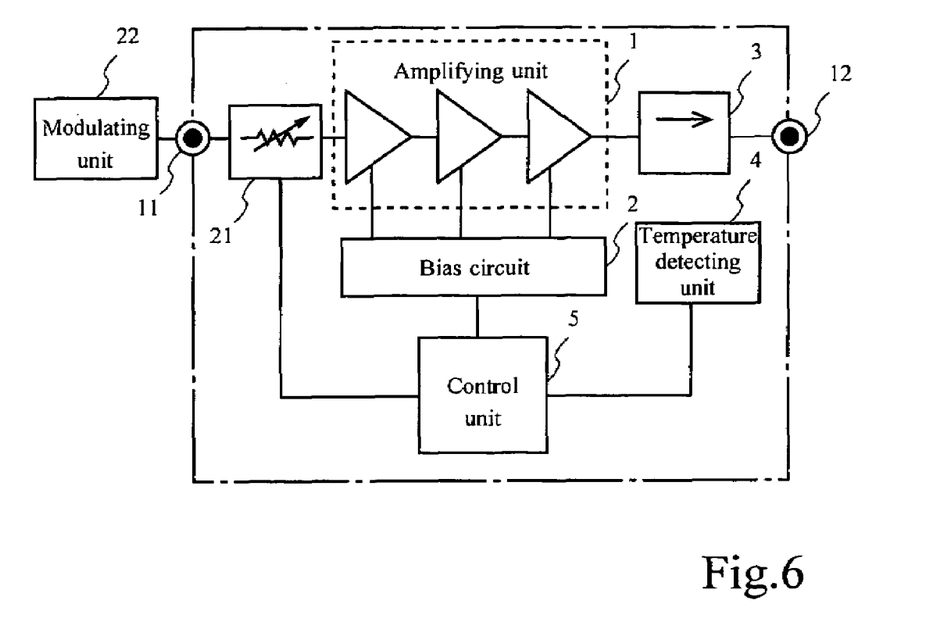
FIG. 6 is a diagram showing an example of a constitution of a transmission amplifier according to a second embodiment of the invention.

FIG. 6 shows an example of a constitution of the transmission amplifier in the second embodiment. A modulating unit 22 provided at a pre-stage of the transmission amplifier of the second embodiment is shown. In the figure, components 1 to 5, 11, and 12, which are the same as those in the transmission amplifier shown in FIG. 1 in the first embodiment, are denoted by the identical reference numerals.

As shown in FIG. 6, in the transmission amplifier in the second embodiment, in the constitution of the transmission amplifier shown in FIG. 1, a variable attenuator (a variable ATT) 21 is further provided between the input terminal 11 and the amplifying unit 1 such that it is possible to control the variable attenuator 21 with the control unit 5.

In the transmission amplifier in the second embodiment, a signal inputted from the input terminal 11 is inputted to the variable attenuator 21 and a signal outputted from the variable attenuator 21 is inputted to the amplifying unit 1. The variable attenuator 21 attenuates the signal inputted from the input terminal 11 with a variable attenuation amount controlled by the control unit 5 and outputs the signal to the amplifying unit 1.

When the gate-to-source voltage Vgs of the amplifying unit 1 is the usual bias voltage Vgs1 other than the time of low temperature, for example, the control unit 5 sets an attenuation amount of the variable attenuator 21 to zero or a value close to zero and controls the variable attenuator not to attenuate a signal. In this case, a signal inputted from the input terminal 11 is inputted to the amplifying unit 1 with the same attenuation or smaller attenuation, and a usual amplification operation is performed.

On the other hand, when a bias of the amplifying unit 1 is controlled and the gate-to-source voltage Vgs is controlled to Vgs2 at the time of low temperature, for example, the control unit 5 controls an attenuation amount of the variable attenuator 21 to a large value and controls the variable attenuator 21 to attenuate a signal. In this case, a modulated signal inputted form the modulating unit 22 is not amplified according to a degree of the attenuation by the variable attenuator 21.

As described above, in the transmission amplifier in the second embodiment, the variable attenuator 21 is provided on the input side of the amplifying unit 1. During the control for controlling biases of the amplifying elements to facilitate self-heating of the amplifying unit 1, an input signal is attenuated by the variable attenuator 21.

Therefore, in the transmission amplifier in the second embodiment, at the time of low temperature and during control of biases of the amplifying elements, an input signal from the modulating unit 22 is attenuated by the variable attenuator 21. Thus, it is possible not to output unnecessary waves.

Note that, in the second embodiment, amplifying-unit-self-heating-facilitation-control-time-signal attenuating means is constituted by a function with which the variable attenuator 21 is controlled by the control unit 5 to attenuate an input signal during control of a bias of the amplifying unit 1.

A transmission amplifier according to a third embodiment will be explained.

Figure 7:
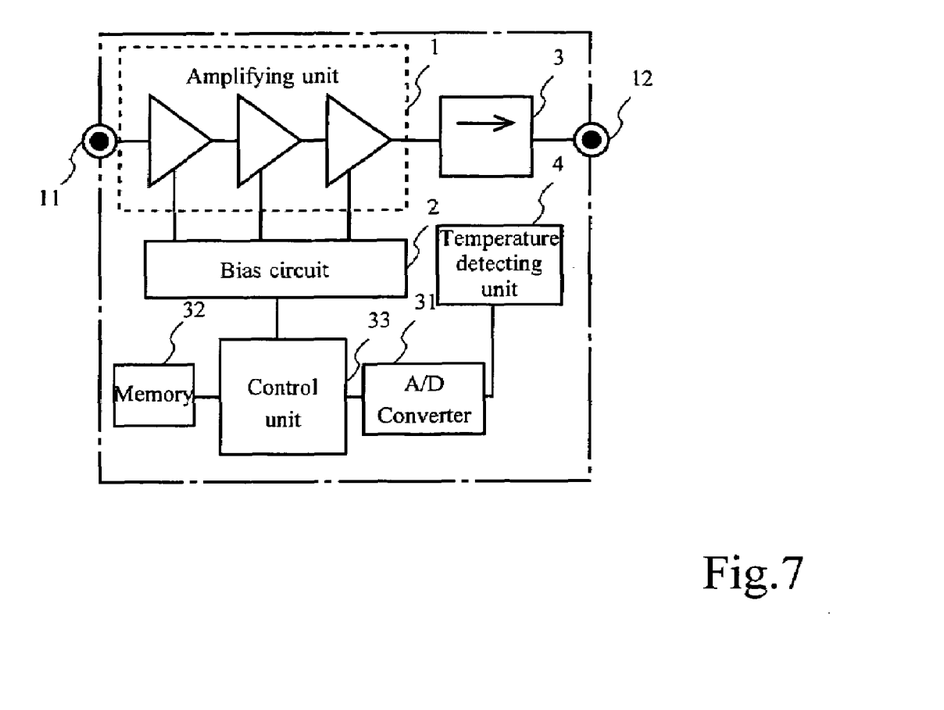
FIG. 7 is a diagram showing an example of a constitution of a transmission amplifier according to a third embodiment of the invention.

FIG. 7 shows an example of a constitution of the transmission amplifier in the third embodiment. Note that, in the figure, components 1 to 4, 11, and 12, which are the same as those in the transmission amplifier shown in FIG. 1 of the first embodiment, are denoted by the identical reference numerals.

As shown in the figure, in the transmission amplifier in the third embodiment, in the constitution of the transmission amplifier shown in FIG. 1, an A/D converter 31 is provided between a control unit 33 and the temperature detecting unit 4 and a memory 32 is provided outside the control unit 33. The A/D conversion function and the storing function do not always have to be incorporated in the control unit 33.

In the third embodiment, for example, the first threshold value Tth1 and the second threshold value Tth2 concerning temperature are set in the memory 32 in advance.

An A/D converter 31 converts a result of temperature detection outputted from the temperature detecting unit 4 as an analog signal into a digital signal and outputs the digital signal to the control unit 33.

The control unit 33 compares a result of temperature detection T in a digital value inputted from the A/D converter 31 and the first threshold value Tth1 and the second threshold value Tth2 stored in the memory 32. The control unit 33 performs control of biases of respective amplifying elements according to a result of the comparison.

As described above, in the constitution of the transmission amplifier in the third embodiment, it is also possible to obtain, for example, the same effect as the transmission amplifier shown in FIG. 1 of the first embodiment.

In the constitution of the transmission amplifier in the third embodiment, it is also possible to adopt, for example, the constitution including a variable attenuator for attenuating an input signal as shown in FIG. 6 of the second embodiment.

A transmission amplifier according to a fourth embodiment will be explained.

For example, in a feed-forward control amplifier used in a mobile radio system, in general, warm-up for the apparatus is necessary in order to avoid a fall in a gain of an output level with respect to an input level. In recent years, a method of reducing time for the warm-up has been examined because of a demand for a reduction in build-up time. However, since a temperature difference, at which the apparatus comes in to a thermal equilibrium state, is different according to an input level, it is necessary to set judgment criteria of for the temperature difference effectively.

Figure 8:
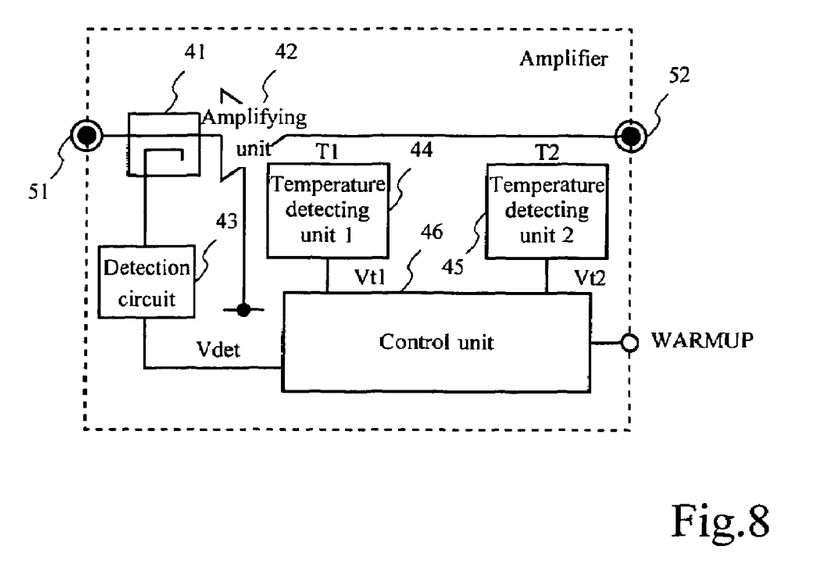
FIG. 8 is a diagram showing an example of a constitution of a transmission amplifier according to a fourth embodiment of the invention.

FIG. 8 shows an example of a constitution of the transmission amplifier in the fourth embodiment.

The transmission amplifier in the fourth embodiment includes a directional coupler 41, an amplifying unit 42, a detection circuit 43, a first temperature detecting unit (the temperature detecting unit 1) 44 constituted by a temperature sensor, a second temperature detecting unit (the temperature detecting unit 2) 45 constituted by a temperature sensor, a control unit 46, an input terminal 51, and an output terminal 52.

In the fourth embodiment, the first temperature detecting unit 44 is arranged near the amplifying unit 42 to be thermally coupled with the amplifying unit 42. On the other hand, the second temperature detecting unit 45 is arranged in a position apart from the amplifying unit 42 in the amplifier to be set in a loose coupling state thermally. The second temperature detecting unit 45 may also be set less thermally coupled with the amplifying unit 42 than the first temperature detecting unit 44.

As a function of detecting temperature, for example, a constitution, in which a temperature IC (Integrated Circuit) for outputting a voltage corresponding to temperature is used, is generally adopted. As other functions, it is also possible to adopt a constitution in which a thermistor or the like is used.

Figure 9:
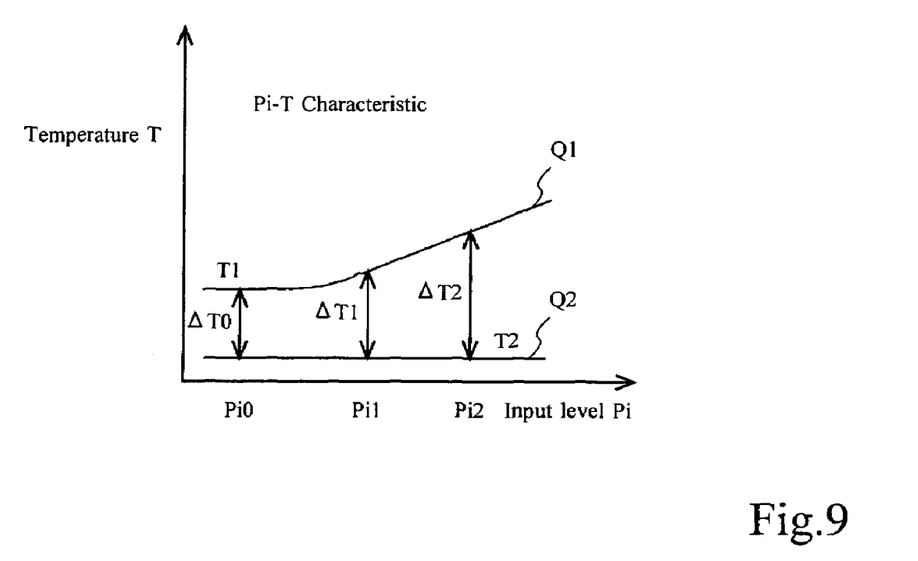
FIG. 9 is a diagram showing an example of a relation between an input level to an amplifier and temperature.

FIG. 9 shows an example of a relation of first temperature T1 detected by the first temperature detecting unit 44 and second temperature T2 detected by the second temperature detecting unit 45 with respect to a level Pi of a signal inputted to the amplifying unit 42. In a graph of the figure, an abscissa indicates the level Pi of an input signal to the amplifier 42 and an ordinate indicates temperature T. The graph shows a characteristic Q1 concerning the first temperature T1 and a characteristic Q2 concerning the second temperature T2.

As shown in FIG. 9, when the input level Pi increases, the first temperature T1 rises because heating of the amplifying unit 42 itself increases. On the other hand, since the second temperature T2 is in a loose coupling state with the amplifying unit 42 thermally, the second temperature T2 is independent from the input level Pi.

In the fourth embodiment, when the input level Pi to the amplifying unit 42 is Pi0, a temperature difference $\Delta T$ between the first temperature T1 and the second temperature T2 at the time when the transmission amplifier is in the thermal equilibrium state is set to $\Delta T0$. Similarly, when the input level Pi to the amplifying unit 42 is Pi1, the temperature difference $\Delta T$ between the first temperature T1 and the second temperature T2 at the time when the transmission amplifier is in the thermal equilibrium state is set to $\Delta T1$. Similarly, when the input level Pi to the amplifying unit 42 is Pi2, the temperature difference $\Delta T$ between the first temperature T1 and the second temperature T2 at the time when the transmission amplifier is in the thermal equilibrium state is set to $\Delta T2$.

Figure 10:
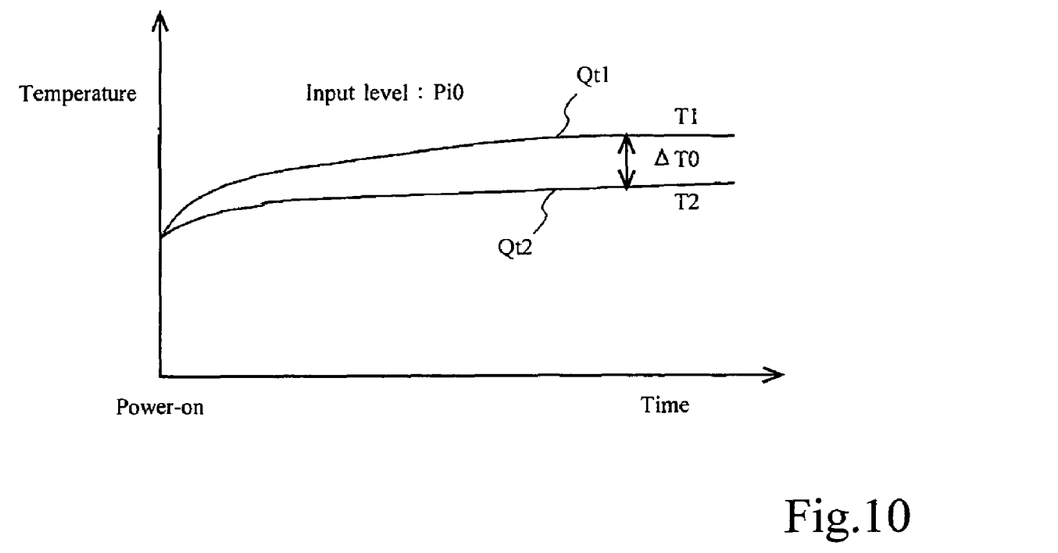
FIG. 10 is a diagram showing an example of a relation between time and temperature at the time of a predetermined input level.

FIG. 10 shows, concerning the transmission amplifier in the fourth embodiment, an example of a relation between elapsed time t from power-on and the temperature T at the time when the input level Pi is Pi0. In a graph of FIG. 10, an abscissa indicates time and an ordinate indicates temperature. The graph shows a characteristic Qt1 concerning the first temperature T1 and a characteristic Qt2 concerning the temperature T2.

As shown in FIG. 10, a magnitude of the temperature difference $\Delta T$ (=T1−T2) is zero or very small at the time of power-on. However, as time elapses, the temperature difference $\Delta T$ increases and, when sufficient time elapses, the temperature difference $\Delta T$ reaches a predetermined value $\Delta T0$.

In the transmission amplifier in the fourth embodiment, the relation between the input level Pi and the temperature difference $\Delta Ti$ shown in FIG. 9 is stored in a memory in the control unit 46 as a judgment criterion for the temperature difference $\Delta T$ corresponding to the input level Pi.

Figure 11:
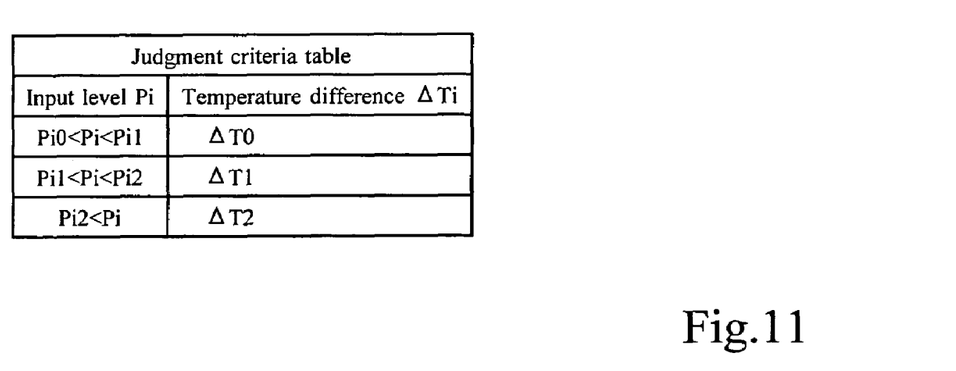
FIG. 11 is a diagram showing an example of a judgment criteria table.

FIG. 11 shows an example of a judgment criteria table stored in the memory in the control unit 46. In the judgment criteria table in the fourth embodiment, the "input level Pi larger than Pi0 and smaller than Pi1" and a temperature difference "$\Delta T0$" are associated with each other, the "input level Pi larger than Pi1 and smaller than Pi2" and a temperature difference "$\Delta T1$" are associated with each other, and the "input level Pi larger than Pi2" and a temperature difference "$\Delta T2$" are associated with each other.

Note that, as judgment criteria corresponding to such input levels, it is desirable that, for example, the judgment criteria are sectioned according to a type of an amplifier. In the fourth embodiment, sections at three stages are provided using Pi0, Pi1, and Pi2. However, for example, it is desirable to take into account an appropriate section according to an operation class of the amplifier. As an example, in an amplifier of an AB class, since a change in power consumption due to an input level is large, it is desirable to increase sections of the input level.

In the transmission amplifier in the fourth embodiment, a signal inputted from the input terminal 51 is amplified by the amplifying unit 12 and outputted from the output terminal 52. Apart of the input signal is acquired by the directional coupler 41 and the signal acquired is detected by the detection circuit 43. Consequently, information on the level Pi of the input signal detected is inputted to the control unit 46. Information on the first temperature T1 detected by the first temperature detecting unit 44 and information on the second temperature T2 detected by the second temperature detecting unit 45 are inputted to the control unit 46. When warming-up processing is performed to warm the amplifying unit 42, the control unit 46 specifies a threshold value $\Delta Ti$ concerning the temperature different $\Delta T$ corresponding to the input level Pi notified from the detection circuit 43. When the difference $\Delta T$ between the temperature T1 and the temperature T2 notified from the two temperature detecting units 44 and 45 increases to be equal to or larger than the threshold value $\Delta Ti$, the control unit 46 performs control for stopping the warming-up processing.

Figure 12:
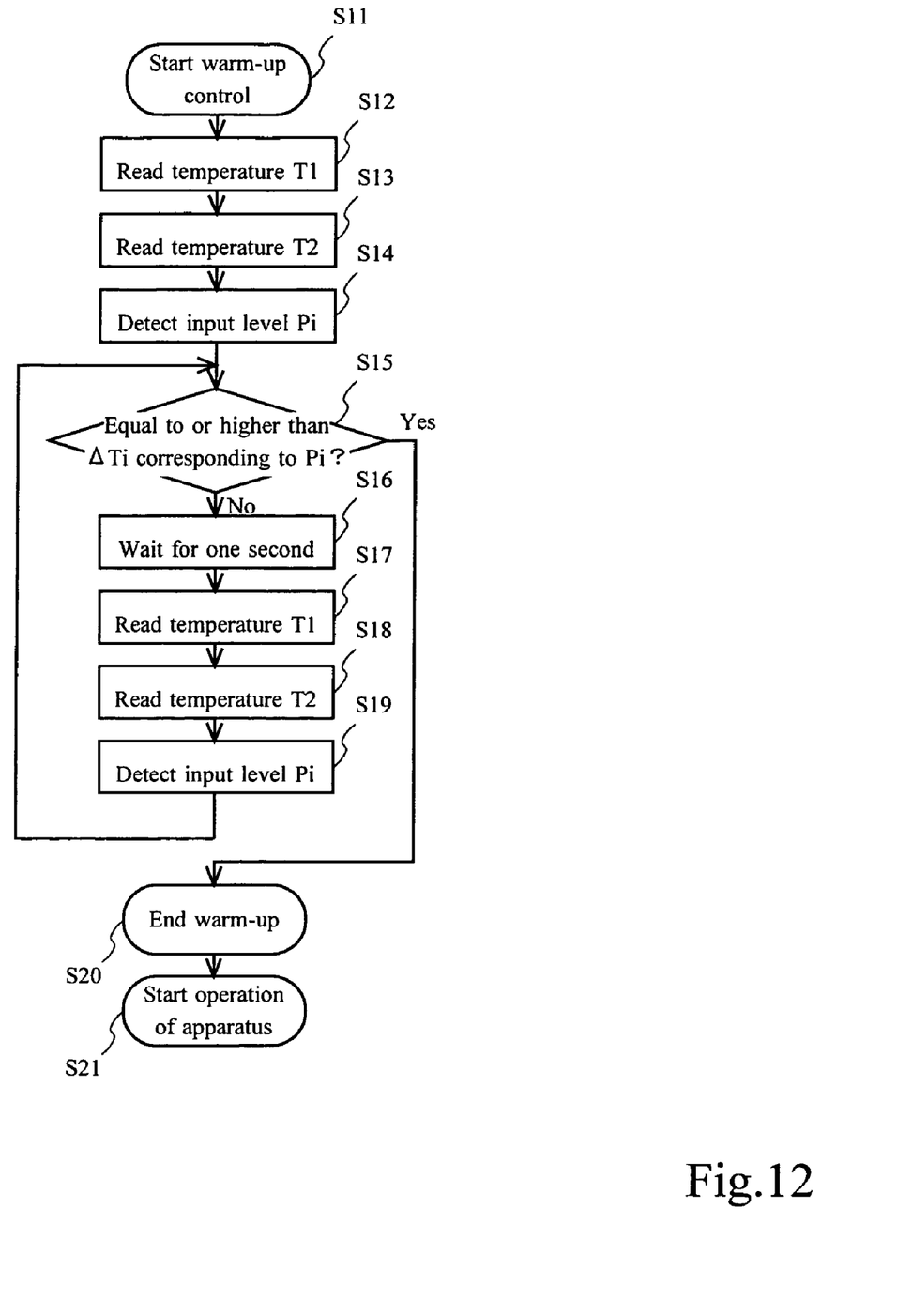
FIG. 12 is a diagram showing an example of a procedure of processing for warm-up control.

FIG. 12 shows an example of a control procedure of warm-up processing performed by the transmission amplifier in the fourth embodiment.

In the transmission amplifier in the fourth embodiment, when warm-up control is started (step S11), the first temperature detecting unit 44 reads the first temperature T1 (step S12), the second temperature detecting unit 45 reads the second temperature T2 (step S13), and the detection circuit 43 detects the input level Pi to the amplifying unit 42 (step S14). The control unit 46 judges whether the temperature difference $\Delta T$ between the first temperature T1 and the second temperature T2 is equal to or larger than a threshold value (in the fourth embodiment, the temperature difference $\Delta Ti$ corresponding to the input level Pi is shown in FIG. 11) corresponding to the input level Pi (step S15). When the temperature difference $\Delta T$ is equal to or larger than the threshold value (i.e., $\Delta T \geq \Delta Ti$), the control unit 46 stops and ends the warm-up processing (step S20) and starts operation of the apparatus (step S21).

On the other hand, when the temperature difference $\Delta T$ between the first temperature T1 and the second temperature T2 is smaller than the threshold value (in the fourth embodiment, $\Delta Ti$) corresponding to the input level Pi (i.e., $\Delta T < \Delta Ti$) (step S15), the control unit 46 waits for time set as a predetermined period, for example, one second (step S16). Then, the first temperature detecting unit 44 reads the first temperature T1 (step S17), the second temperature detecting unit 45 reads the second temperature T2 (step S18), and the detection circuit 43 detects the input level Pi to the amplifying unit 42 (step S19). The control unit 46 performs the processing for judging whether the warm-up processing should be ended in the same manner as described above (step S15 to step S21).

As described above, the transmission amplifier in the fourth embodiment has the function of judging a warmed-up state of the amplifying unit (the amplifier) 42. Specifically, the temperature detecting unit 44 is provided in a position near the amplifying unit 42, the second temperature detecting unit 45 is provided in a position far distant from the amplifying unit 42 compared with the arrangement position of the temperature detecting unit 44 is disposed and a position where no large heating source is present in the amplifying unit 42, and the detection circuit 43 is provided at an input stage of the amplifying unit 42. The memory in the control unit 46 stores information on the threshold value (the temperature difference) $\Delta Ti$ serving as a criterion for judging whether warm-up is required, which is the temperature difference $\Delta Ti$ between the first temperature T1 in the arrangement position of the first temperature detecting unit 44 and the second temperature T2 in the arrangement position of the second temperature detecting unit 45 and is the temperature difference $\Delta Ti$ corresponding to the signal level Pi detected by the detection circuit 43. The control unit 46 reads signals from the first temperature detecting unit 44 and the second temperature detecting unit 45 and a signal from the detection circuit 43, calculates the temperature difference $\Delta T$ between the temperatures T1 and T2 in the arrangement positions of the first temperature detecting unit 44 and the second temperature detecting unit 45, and compares the threshold value (the temperature difference) $\Delta Ti$ corresponding to the signal level Pi detected by the detection circuit 43, which is stored in the memory as a judgment criterion, and the calculated temperature difference $\Delta T$ corresponding to the signal level Pi. When the calculated temperature difference $\Delta T$ is equal to or larger than the temperature difference $\Delta Ti$ serving as the judgment criterion, the control unit 46 ends the warm-up and instructs start of operation of the apparatus.

Therefore, in the transmission amplifier in the fourth embodiment, the judgment criterion $\Delta Ti$ concerning the temperature difference $\Delta T$ is optimized in association with the input level Pi of the amplifying unit (the amplifier) 42. Thus, it is possible to realize efficiency of warm-up. For example, concerning the amplifying unit 42, a difference in a temperature difference depending on an input level until the transmission amplifier comes into the thermal equilibrium state can be solved. For example, it is possible to reduce time required for the warm-up processing effectively according to the input level Pi. Consequently, it is possible to reduce time until start of operation of the apparatus or until start of measurement of a radio characteristic or the like. Specifically, it is judged whether the transmission amplifier comes into the thermal equilibrium state on the basis of the temperature difference $\Delta T$ at the time of power-on or the like of the apparatus. Thus, for example, when the apparatus is reset once and start of operation of the apparatus is started again, it is possible to start operation of the apparatus immediately or in a short time without waiting for a long time until completion of warm-up. In the fourth embodiment, the judgment is performed using a relative value of the temperature difference rather than an absolute value of temperature, the judgment is not affected by an installation place of the apparatus.

Note that, in the transmission amplifier in the fourth embodiment, the signal level detecting means is constituted by the function of the detection circuit 43. The temperature detecting means is constituted by the function of the first temperature detecting unit 44 for detecting the first temperature T1 and the function of the second temperature detecting unit 45 for detecting the second temperature T2. The amplifying-unit-warm-up-processing control means is constituted by the function of the control unit 46 for performing control for the warm-up processing. The signal-level-and-temperature-difference threshold-correspondence storing means is constituted by the function of the memory in the control unit 46 for storing correspondence of a signal level and a threshold value (a temperature difference) concerning a temperature difference.

Next, an example of a transmission amplifier, which warms an amplifying unit using a heater, is described as a comparative example for the transmission amplifiers according to the first to the third embodiments. Note that all explanations for the transmission amplifier according to this comparative example are not always conventional techniques.

Figure 13:
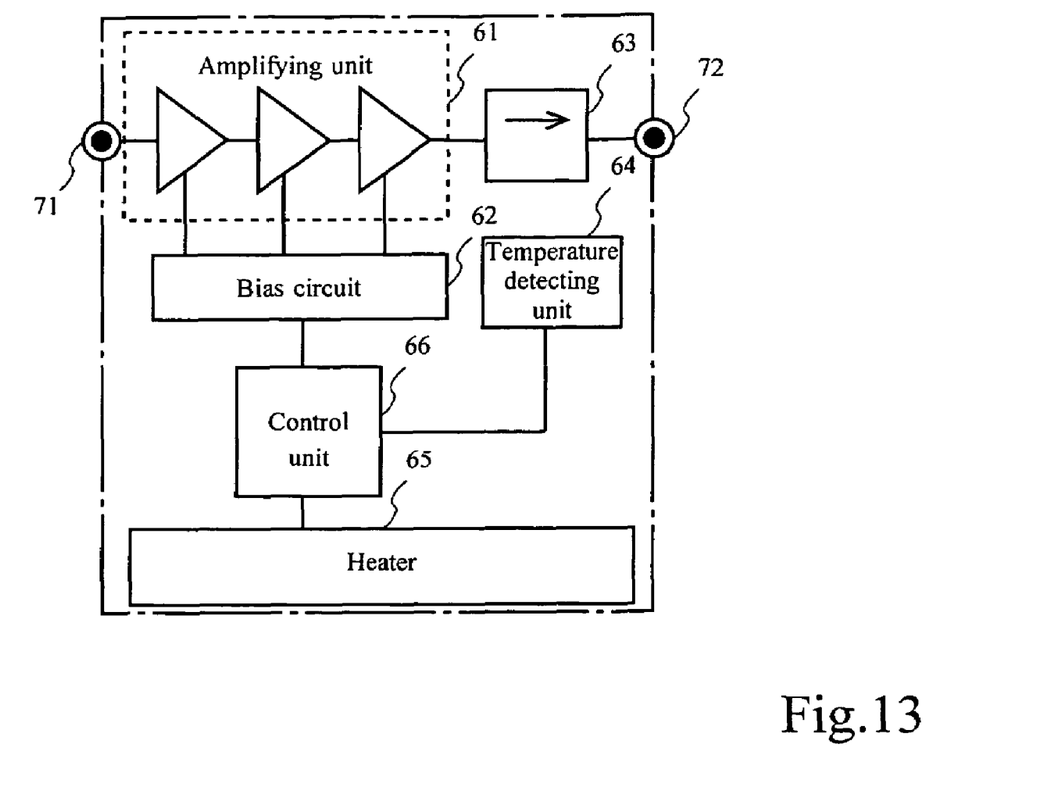
FIG. 13 is a diagram showing an example of a constitution of a transmission amplifier using a heater.

FIG. 13 shows an example of a constitution of the transmission amplifier according to this comparative example.

The transmission amplifier according to this comparative example includes an amplifying unit 61, a bias circuit 62, an isolator 63, a temperature detecting unit 64, a heater 65, a control unit 66, an input terminal 71, and an output terminal 72. The transmission amplifier warms the amplifying unit 61 with the heater 65 according to control by the control unit 66 on the basis of a result of temperature detection by the temperature detecting unit 64.

Constitutions of the transmission amplifiers and the like according to the invention are not always limited to those described above. Note that it is also possible to provide the invention as, for example, a method or a system for executing the processing according to the invention, a program for realizing such a method and a system, and the like.

Fields of application of the invention are not always limited to those described above. It is possible to apply the invention to various fields. For example, it is possible to apply the technical thought according to the invention not only to the transmission amplifier but also various apparatuses installed outdoors.

As various kinds of processing performed in the transmission amplifier and the like according to the invention, for example, in hardware resources including a processor and a memory, the processor may execute a control program stored in a ROM (Read Only Memory) to control processing. For example, respective functional means for executing the processing maybe constituted as independent hardware circuits.

The invention can also be grasped as a computer-readable recording medium such as a floppy (registered trademark) disc or a CD (Compact Disc)-ROM having the control program stored therein and the program (itself). It is possible to cause a computer to carry out the processing according to the invention by inputting the control program to the computer from the recording medium and causing a processor to execute the control program.

As explained above, according to the transmission amplifier according to the invention, in the constitution for amplifying a signal to be transmitted with the amplifying unit for amplifying a signal, for example, temperature of the amplifying unit is detected and, when the detected temperature is lower than a predetermined threshold value or equal to or lower than the predetermined threshold value, control for facilitating self-heating by the amplifying unit is performed. Thus, it is possible to warm the amplifying unit efficiently when temperature is low. For example, compared with the constitution in which a heater or the like is added, it is possible to reduce cost and realize a reduction in size of the transmission amplifier.

In the transmission amplifier according to the invention, when the control for facilitating self-heating by the amplifying unit is performed, a signal to be amplified by the amplifying unit is attenuated. Thus, in such time, it is possible to prevent an unnecessary signal from being outputted.

The invention claimed is:

1. A transmission amplifier for amplifying a signal to be transmitted, said transmission amplifier comprising:
    an amplifying unit configured to amplify the signal;
    signal level detecting means for detecting a level of the signal;
    temperature detecting means for detecting a first temperature at a thermally coupled first position with said amplifying unit and for detecting a second temperature at a second position that is less thermally coupled with said amplifying unit than the first position; and
    an amplifying-unit-warm-up-processing control device configured to stop warm-up processing for said amplifying unit, when, in performing the warm-up processing for said amplifying unit, a difference between the first temperature and the second temperature detected by said temperature detecting means is equal to or larger than a threshold value corresponding to a signal level detected by said signal level detecting means.

2. A transmission amplifier according to claim 1, further comprising:
    a signal-level-and-temperature-difference-threshold-correspondence storing device configured to store a correspondence of the signal level and the threshold value concerning the temperature difference,
    wherein said amplifying-unit-warm-up-processing control device is configured to control the warm-up processing for said amplifying unit on the basis of contents of the correspondence stored by the signal-level-and-temperature-difference-threshold-correspondence storing device.

3. A transmission amplifier according to claim 1, wherein said amplifying-unit-warm-up-processing control device is configured to detect, for every predetermined period, a difference between a first temperature and a second temperature detected by said temperature detecting means.

* * * * *